(12) United States Patent
Wang et al.

(10) Patent No.: US 10,073,135 B2
(45) Date of Patent: Sep. 11, 2018

(54) ALIGNMENT TESTING FOR TIERED SEMICONDUCTOR STRUCTURE

(71) Applicant: Taiwan Semiconductor Manufacturing Company Limited, Hsin-Chu (TW)

(72) Inventors: Mill-Jer Wang, Hsinchu (TW); Ching-Nen Peng, Hsinchu (TW); Hung-Chih Lin, Hsinchu (TW); Hao Chen, New Taipei (TW); Mincent Lee, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/601,226

(22) Filed: May 22, 2017

(65) Prior Publication Data
US 2017/0254849 A1 Sep. 7, 2017

Related U.S. Application Data

(62) Division of application No. 14/063,414, filed on Oct. 25, 2013, now Pat. No. 9,658,281.

(51) Int. Cl.
*G01R 31/28* (2006.01)
*G01R 31/26* (2014.01)
(Continued)

(52) U.S. Cl.
CPC ......... *G01R 31/2834* (2013.01); *G01R 31/04* (2013.01); *G01R 31/2601* (2013.01);
(Continued)

(58) Field of Classification Search
CPC .............. G01R 31/2834; G01R 31/04; G01R 31/2601; G01R 31/2884; G01R 31/2891;
(Continued)

(56) References Cited

U.S. PATENT DOCUMENTS

| 4,024,944 | A | * | 5/1977 | Adams | B65G 47/24 198/394 |
| 5,513,948 | A | * | 5/1996 | Bacchi | B65G 47/24 198/394 |
| 5,617,340 | A | * | 4/1997 | Cresswell | G01R 31/2818 702/85 |
| 7,977,962 | B2 | * | 7/2011 | Hargan | G01R 31/2853 324/762.01 |

(Continued)

*Primary Examiner* — Patrick Assouad
*Assistant Examiner* — Khristopher Yodichkas
(74) *Attorney, Agent, or Firm* — Cooper Legal Group, LLC

(57) ABSTRACT

Among other things, one or more techniques or systems for evaluating a tiered semiconductor structure, such as a stacked CMOS structure, for misalignment are provided. In an embodiment, a connectivity test is performed on vias between a first layer and a second layer to determine a via diameter and a via offset that are used to evaluate misalignment. In an embodiment, a connectivity test for vias within a first layer is performed to determine an alignment rotation based upon which vias are connected through a conductive arc within a second layer or which vias are connected to a conductive pattern out of a set of conductive patterns. In this way, the via diameter, the via offset, or the alignment rotation are used to evaluate the tiered semiconductor structure, such as during a stacked CMOS process, for misalignment.

20 Claims, 12 Drawing Sheets

(51) Int. Cl.
*G01R 31/04* (2006.01)
*G01B 7/12* (2006.01)
*G01R 31/3185* (2006.01)
*G01R 31/02* (2006.01)

(52) U.S. Cl.
CPC ..... *G01R 31/2884* (2013.01); *G01R 31/2891* (2013.01); *G01B 7/12* (2013.01); *G01B 2210/56* (2013.01); *G01R 31/026* (2013.01); *G01R 31/318513* (2013.01)

(58) Field of Classification Search
CPC .......... G01R 31/026; G01R 31/318513; G01B 7/12; G01B 2210/56
USPC ....................................................... 324/750.3
See application file for complete search history.

(56) References Cited

U.S. PATENT DOCUMENTS

| | | | | |
|---|---|---|---|---|
| 8,421,073 B2* | 4/2013 | Lin | ......................... | H01L 22/14 257/48 |
| 8,569,899 B2* | 10/2013 | Zhang | ..................... | H01L 22/34 257/71 |
| 8,858,774 B2* | 10/2014 | Mayer | ..................... | C25D 21/12 204/228.8 |
| 9,208,898 B2* | 12/2015 | Jeong | ............. | G01R 31/318513 |
| 9,678,142 B2* | 6/2017 | Ryckaert | ............ | G01R 31/2644 |
| 2012/0258408 A1* | 10/2012 | Mayer | ..................... | C25D 21/12 430/325 |
| 2015/0061721 A1* | 3/2015 | Jeong | .................. | G11C 29/025 324/762.01 |

\* cited by examiner

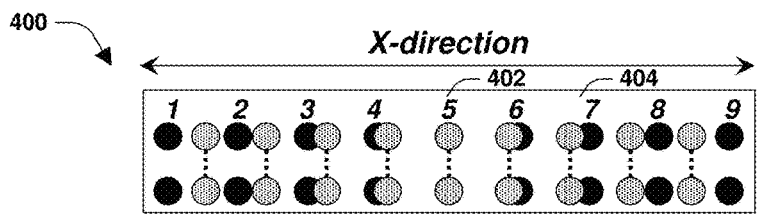
FIG. 4A
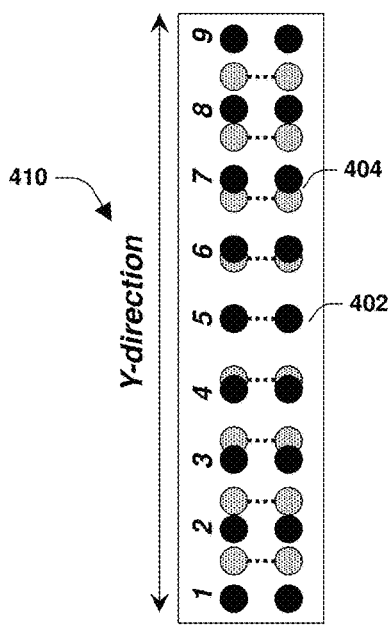
FIG. 4B
FIG. 4C

ALIGNMENT TESTING FOR TIERED SEMICONDUCTOR STRUCTURE

RELATED APPLICATION

This application is a divisional of and claims priority to U.S. patent application Ser. No. 14/063,414, titled "ALIGNMENT TESTING FOR TIERED SEMICONDUCTOR STRUCTURE" and filed on Oct. 25, 2013, which is incorporated herein by reference.

BACKGROUND

A tiered semiconductor structure, such as a stacked CMOS structure, comprises a plurality of tiers within which semiconductor devices, such as PMOS or NMOS devices, are formed. In an example, a first tier comprises a first structure of a semiconductor device and a second tier comprises a second structure of the semiconductor device. A via is used to connect the first structure to the second structure. Because tier-to-tier vias are relevantly small, such as a via having a diameter less than 0.3 µm, misalignment, incomplete tunneling, or over tunneling can occur during a stacking process, such as a CMOS stacking process, that results in stacking system yield loss or other penalties.

DESCRIPTION OF THE DRAWINGS

FIG. 4A is an illustration of evaluating a tiered semiconductor structure in a first alignment direction, according to some embodiments.

FIG. 4B is an illustration of evaluating a tiered semiconductor structure in a second alignment direction, according to some embodiments.

FIG. 4C is an illustration of alignment measurements derived from an evaluation of a tiered semiconductor structure in multiple directions, according to some embodiments.

DETAILED DESCRIPTION

Figure 1:
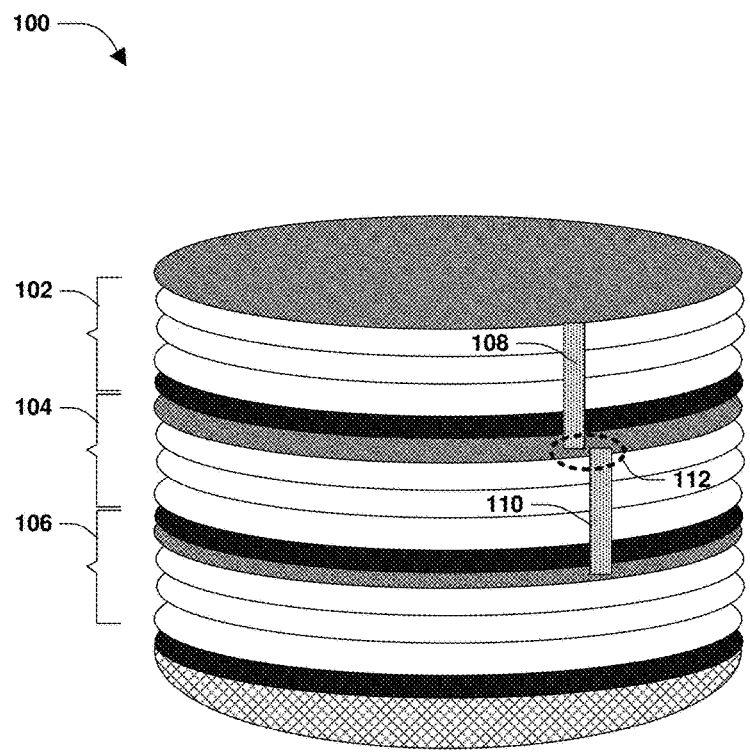
FIG. 1 is an illustration of a tiered semiconductor structure, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more techniques or systems for evaluating a tiered semiconductor structure are provided. In an embodiment, the tiered semiconductor structure is tested for alignment in one or more dimensions by measuring a via diameter and an offset distance between a first set of vias within a first layer of the tiered semiconductor structure and a second set of vias within a second layer of the tiered semiconductor structure. In an embodiment, the tiered semiconductor structure is tested for alignment rotation in one or more dimensions by determining which vias within a first layer are connected by a conductive arc within in a second layer of the tiered semiconductor structure. In an embodiment, test structures, used to test for alignment, are formed on a wafer edge, a scribe line, or within a device of the tiered semiconductor structure. In an embodiment, test signals are transmitted, such as from a source separate from a test structure, utilizing a contact probe, a contactless coupling, or a probe coupling hybrid. In an embodiment, alignment is tested during various stages of a CMOS stacking processing, such as during or between a wafer fabrication stage, a wafer bonding stage, a known good die (KGD) bonding stage or iterations therein, etc. In an embodiment, one or more optional units are invoked by alignment testing during the CMOS stacking processing, such as a testing unit, a repair unit, or a fault tolerance unit. In this way, misalignment and quantization of such are efficiently detected for three-dimensional integrated circuit (3DIC) stacking processes so that misalignment issues are detected early for reprocessing, repair, etc.

FIG. 1 illustrates a tiered semiconductor structure 100. The tiered semiconductor structure 100 comprises one or more tiers, such as a first tier 102, a second tier 104, a third tier 106, or other tiers not illustrated. In an embodiment, an integrated circuit is formed across one or more tiers, such that a tier comprises a portion of the integrated circuit. Such portions are electrically connected by vias. In an embodiment, a tunnel is formed through the second tier 104 to create a via 110, such as a bottom via portion, during processing of the second tier 104. A tunnel is formed through the first tier 102 to create a via 108, such as a top via portion, during processing of the first tier 102. Misalignment 112 can occur between the via 108 of the first tier 102 and the via 110 of the second tier 104 due to the relatively small size of vias or other misalignment factors introduced during a stacking process that forms the tiered semiconductor structure 100. Accordingly, as provided herein, alignment is tested during the stacking process so that misalignment is detected or repaired during the stacking process.

Figure 2A:
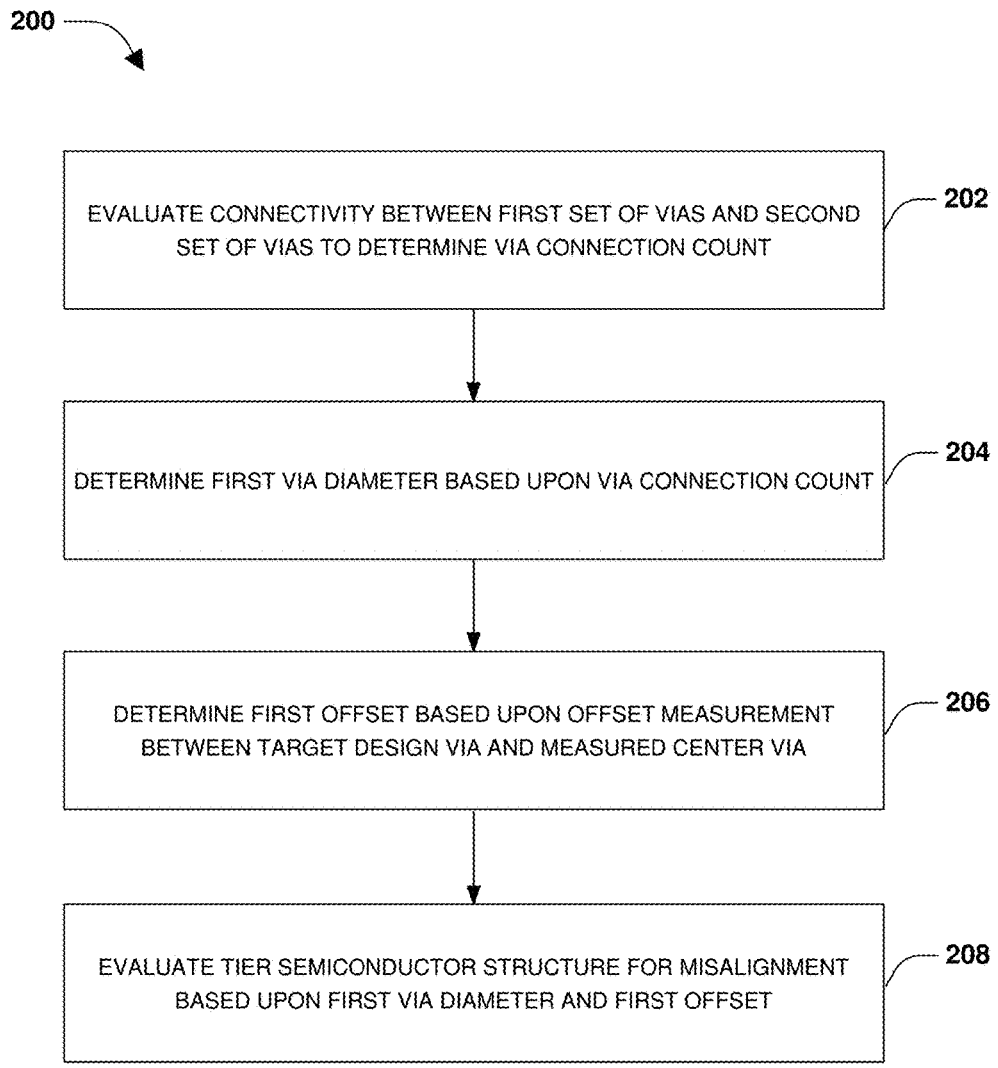
FIG. 2A is a flow diagram illustrating a method of evaluating a tiered semiconductor structure, according to some embodiments.
Figure 2B:
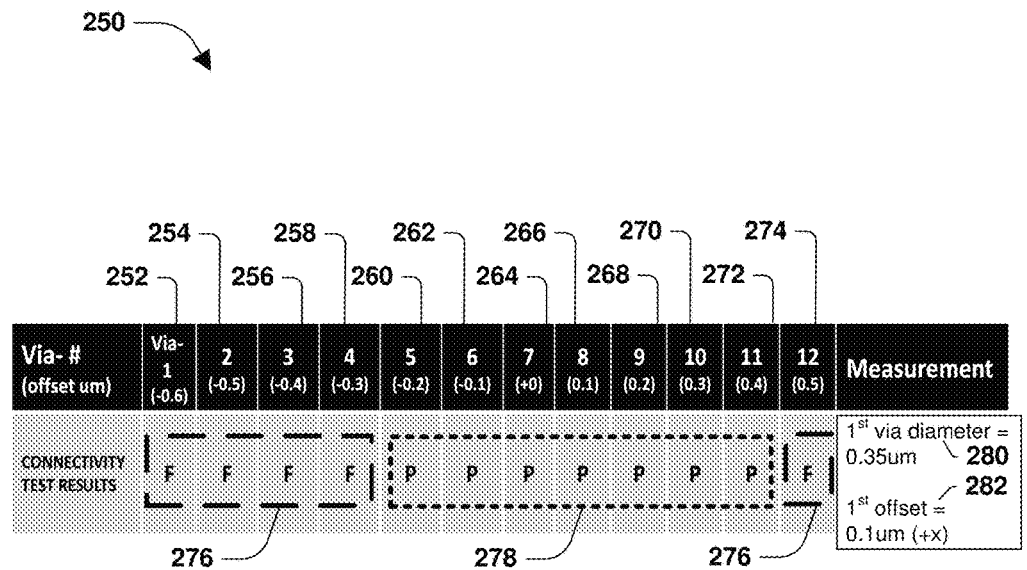
FIG. 2B is an illustration of alignment measurements derived from an evaluation of a tiered semiconductor structure, according to some embodiments.

A method 200 of evaluating a tiered semiconductor structure, such as the tiered semiconductor structure 100, is illustrated in FIG. 2A. The tiered semiconductor structure 100 is evaluated for alignment in order to detect, quantize, or repair misalignment, such as during a stacking process of the tiered semiconductor structure 100 such as a CMOS stacking process. At 202, connectivity is evaluated between a first set of vias within the first layer 102 of the tiered semiconductor structure 100 and a second set of vias within a second layer 104 of the tiered semiconductor structure 100 to determine a via connection count. The via connectivity count corresponding to a number of via connections that pass a connectivity test. In an embodiment, 12 vias, such as a via (1) 252, a via (2) 254, a via (3) 256, a via (4) 258, a via (5) 260, a via (6) 262, a via (7) 264, a via (8) 266, a via (9) 268, a via (10) 270, a via (11) 272, and a via (12) 274 of FIG. 2B, are formed from 12 top via portions within the first set of vias of the first layer 102 and from 12 bottom vias portions within the second set of vias of the second layer 104. Connectivity of a first via is tested by determining whether a first top via portion within the first set of vias is electrically connected to, such as touching, a first bottom via portion within the second set of vias. If the first top via portion is electrically connected to the first bottom via portion, then a first via connection of the first via passes the connectivity test and is included in the via connection count. However, if the first top via portion is not electrically connected to the first bottom via portion, then the first via connection of the first via fails the connectivity test and is not included in the via count. In an embodiment, a via connection count of 7 is determined based upon 7 via connections 278: via (5) 260, via (6) 262, via (7) 264, via (8) 266, via (9) 268, via (10) 270, and via (11) 272 passing the connectivity test and 5 via connections 276: via (1) 252, via (2) 254, via (3) 256, via (4) 258, and via (12) 274 failing the connectivity test, as illustrated by alignment measurements 250 of FIG. 2B.

At 204, a first via diameter 280 for vias of the first set of vias is determined based upon the via connection count and a pitch difference between vias of the first set of vias and vias of the second set of vias, as illustrated by alignment measurements 250 of FIG. 2B. In an example, the pitch difference is 0.1 µm based upon a first via pitch of 0.9 µm between vias in the first set of vias and a second via pitch of 1.0 µm between vias in the second set of vias. In an embodiment, the first via diameter 280 corresponds to half the via connection count multiplied by the pitch difference between vias of the first set of vias and vias of the second set of vias. For example, the first via diameter is determined to be 0.35 µm because half the via connection count of 7 if 3.5 and the pitch difference is 0.1 µm. At 206, a first offset 282 is determined based upon an offset measurement between a target design via and a measured center via, as illustrated by alignment measurements 250 of FIG. 2B. The target design via is a via designated during design to be a center via (e.g., a via intended to be a center via within a group of vias that pass the connectivity test), such as a via (7) 264 where a top via (7) portion of the first set of vias is designed to directly align with a bottom via (7) portion of the second set of vias. The measured center via is a via that is actually centered within a group of vias that pass the connectivity test. As such, the measured center via corresponds to the via where a top via portion directly aligns with a bottom via portion, such as a via (8) 266 where a top via (8) portion that directly aligns with a bottom via (8) portion. The offset measurement corresponds to the pitch difference and a via difference between the measured center via and the target design via. The difference between the measured center via and the target design via is 1 because there is a 1 via difference between the target design via as via (7) 264 and the measured center via as via (8) 266. Accordingly, an offset distance of 0.1 µm is determined for the first offset 282 based upon the 1 via difference and the 0.1 µm pitch difference. An offset direction of a positive x direction is determined based upon the measured center via as via (8) 266 being located in a positive x direction from the target design via as via (7) 264. In this way, the first offset 282 comprising the offset distance and the offset direction is determined. At 208, the tiered semiconductor structure 100 is evaluated for misalignment based upon the first via diameter and the first offset.

Figure 3A:
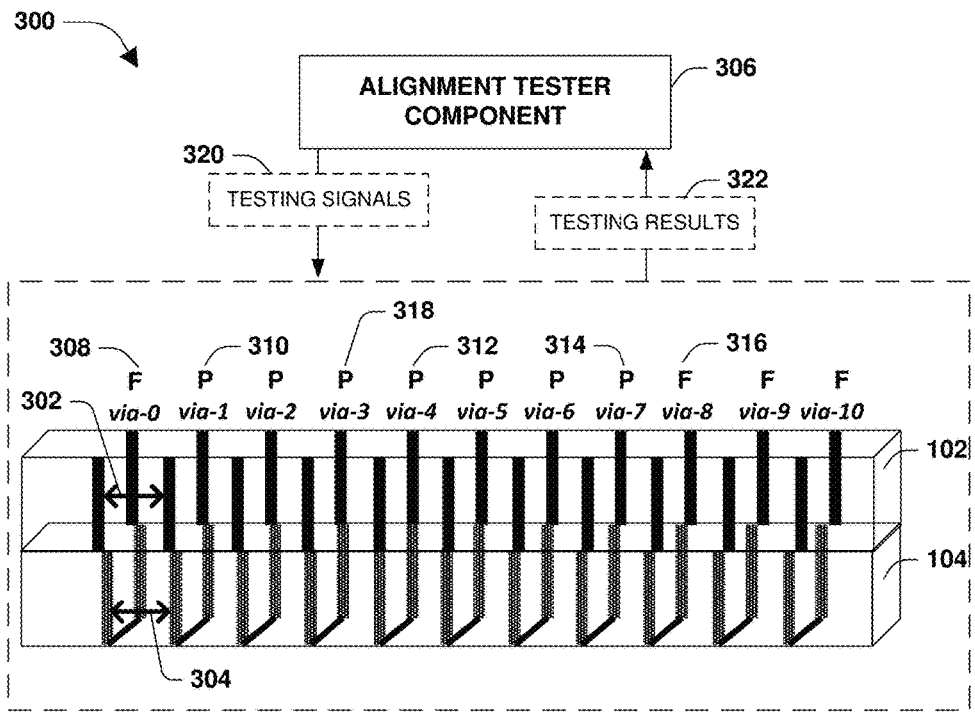
FIG. 3A is an illustration of a system for evaluating a tiered semiconductor structure in a first alignment direction, according to some embodiments.

FIG. 3A illustrates a system 300 for evaluating a tiered semiconductor structure 100 in a first alignment direction. The system 300 comprises an alignment tester component 306 configured to determine a first via diameter and a first offset associated with one or more vias, such as 12 vias, formed by the first layer 102 and the second layer 104 of the tiered semiconductor structure 100. In an embodiment, the first layer 102 comprises a first set of vias comprising top via portions for vias (0)-(10), and the second layer 104 comprises a second set of vias comprising bottom via portions for the vias (0)-(10). Top via portions within the first set of vias have a via pitch 302, such as 1.0 µm. Bottom via portions within the second set of vias have a via pitch 304, such as 0.9 µm. Via (3) 318 is designated as a target design via, such as a via specified during design to be a center via where a top via (3) portion directly aligns with a bottom via (3) portion.

Figure 3B:
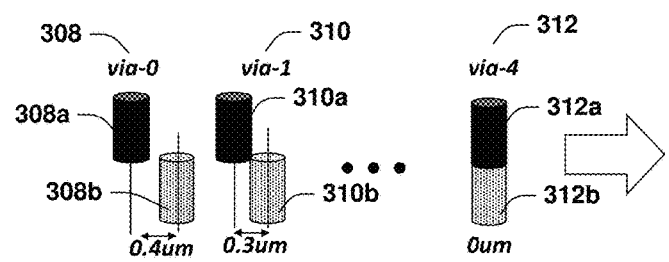
FIG. 3B is an illustration of evaluating connectivity of one or more vias, according to some embodiments.

The alignment tester component 306 is configured to perform a connectivity test to determine a via connection count corresponding to a number of vias having electrical connectivity between top via portions and bottom via portions. In an embodiment, the alignment tester component 306 transmits test signals 320 to test structures, such as the vias, within the tiered semiconductor structure 100 to obtain testing results 322 for the connectivity test. In an embodiment of performing the connectivity test, the alignment tester component 306 determines that a via (0) 308 fails the connectivity test, indicating that a top via (0) portion 308a is not electrically connected, such as touching, a bottom via (0) portion 308b, as illustrated in FIG. 3B. The alignment tester component 306 determines that a via (1) 310 passes the connectivity test, indicating that a top via (1) portion 310a is electrically connected, such as touching, a bottom via (1) portion 310b. The alignment tester component 306 determines that a via (4) 312 passes the connectivity test, indicating that a top via (4) portion 312a is electrically connected, such as touching, a bottom via (4) portion 312b. The alignment tester component 306 determines that the via (4) 312 is a measured center via based upon the top via (4) portion 312a being directly aligned with the bottom via (4) portion 312b. In this way, the alignment tester component 306 determines a via connection count of 7 based upon vias (1)-(7) passing the connectivity test, and via (0) 308 and vias (8)-(10) failing the connectivity test. The alignment tester component 306 is configured to determine a first via diameter based upon the via connection count and a pitch difference between vias of the first set of vias and vias of the second set of vias, such as a first via diameter of 0.35 µm corresponding to half the via connection count of 7 multiplied by a 0.1 µm pitch difference (as explained in the next paragraph) between vias of the first set of vias and vias of the second set of vias.

The alignment tester component 306 is configured to determine a first offset based upon an offset measurement between the target design via, such as the via (3) 318, and a measured center via, such as the via (4) 312. The offset measurement corresponds to the pitch difference multiplied by a via difference between the measured center via and the target design via. A pitch difference of 0.1 µm is determined based upon a difference between the via pitch 302 of 1.0 µm for the first set of vias and the via pitch 304 of 0.9 µm for the second set of vias. A via difference of 1 is determined based upon a 1 via difference between the via (3) 318 as the target design via and the via (4) 312 as the measured center via. Accordingly, an offset difference of 0.1 µm is determined for the first offset based upon the 1 via difference and the 0.1 µm pitch difference of the offset measurement. An offset direction of a positive x direction is determined for the first offset based upon the via (4) 312 as the measured center via being in positive x direction with respect to the via (3) 318 as the target design via. In this way, the alignment tester component 306 determines a first offset of 0.1 µm in the positive x direction. The alignment tester component 306 is configured to evaluate the tiered semiconductor structure 100 for misalignment based upon the first via diameter and the first offset.

In an embodiment, the alignment tester component 306 is configured to evaluate the tiered semiconductor structure for misalignment in multiple directions, such as multiple dimensions, as illustrated in FIGS. 4A, 4B, and 4C. FIG. 4A illustrates performing a first connectivity test 400 in a first direction, such as an x-direction. First measurements 422 of the first connectivity test 400, such as a determination of a first via diameter of 0.35 µm and a first offset of 0.2 µm in a negative x-direction, are illustrated in result set 420 of FIG. 4C. In an embodiment, the first measurements 422 are determined based upon 7 vias, such as vias (2)-(8), passing the first connectivity test 400 and 2 vias, such as via (1) and via (9) failing the first connectivity test 400, where the first via diameter corresponds to half a via connection count of 7 corresponding to the 7 vias that passed the first connectivity test 400 multiplied by a pitch difference of 0.1 µm. The first offset of 0.2 µm in the negative x-direction corresponds to an offset measurement that is based upon a via difference of 2 between a target design via, such as a via (7) 404, and a measured center via, such as a via (5) 402, and based upon the pitch difference of 0.1 µm between a first pitch of vias within the first set of vias and a second pitch of vias within the second set of vias. FIG. 4B illustrates performing a second connectivity test 410 in a second direction, such as a y-direction. Second measurements 424 of the second connectivity test 410, such as a determination of a second via diameter of 0.35 µm and a second offset of 0.2 µm in a negative y-direction, are illustrated in the result set 420 of FIG. 4C. In an embodiment, the second measurements 424 are determined based upon 7 vias, such as vias (2)-(8), passing the second connectivity test 410 and 2 vias, such as via (1) and via (9) failing the second connectivity test 410, where the second via diameter corresponds to half a via connection count of 7 corresponding to the 7 vias that passed the second connectivity test 410 multiplied by a pitch difference of 0.1 µm. The second offset of 0.2 µm in the negative y-direction corresponds to an offset measurement that is based upon a via difference of 2 between a target design via, such as the via (7) 404, and a measured center via, such as the via (5) 402, and based upon the pitch difference of 0.1 µm between the first pitch of vias within the first set of vias and the second pitch of vias within the second set of vias. In this way, the tiered semiconductor structure 100 is evaluated in multiple dimensions for misalignment.

Figure 5A:
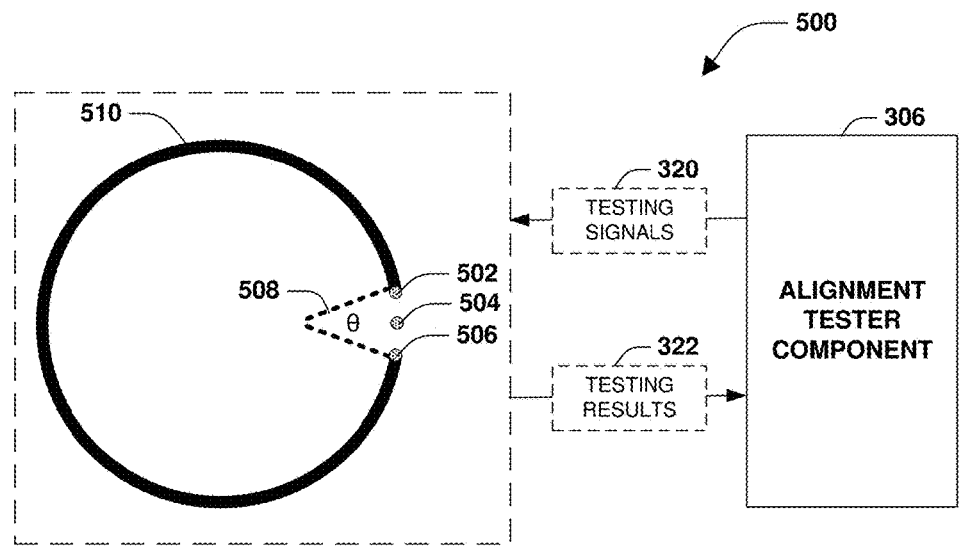
FIG. 5A is an illustration of a system for evaluating a tiered semiconductor structure utilizing a conductive arc, according to some embodiments.
Figure 5B:
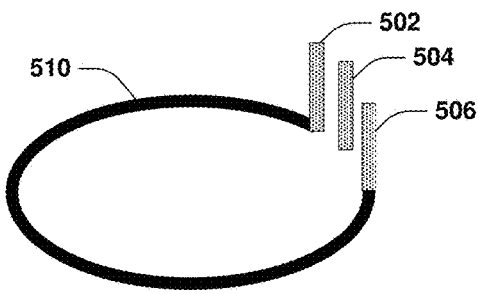
FIG. 5B is an illustration of a perspective view of a conductive arc and one or more vias, according to some embodiments.

FIG. 5A illustrates a system 500 for evaluating the tiered semiconductor structure 100 utilizing a conductive arc 510. The system 500 comprises the alignment tester component 306 configured to evaluate alignment of the tiered semiconductor structure 100 by performing connectivity tests, such as transmitting testing signals 320 to the tiered semiconductor structure 100 to obtain testing results 322. The alignment tester component 306 is configured to evaluate connectivity, through the conductive arc 510 within the second layer 104 of the tiered semiconductor structure 100, between one or more vias within the first layer 102 of the tiered semiconductor structure 100, such as a first via 502, a second via 504, and a third via 506. It is appreciated that any number of vias can be evaluated for connectivity. The conductive arc 510 comprises a notch having a notch angle 508. In an embodiment, the conductive arc 510 comprises a conductive material, such as a metal material, and the notch is non-conductive, such as empty space or air. FIG. 5B illustrates a perspective view of the conductive arc 510 and the one or more vias.

Figure 5C:
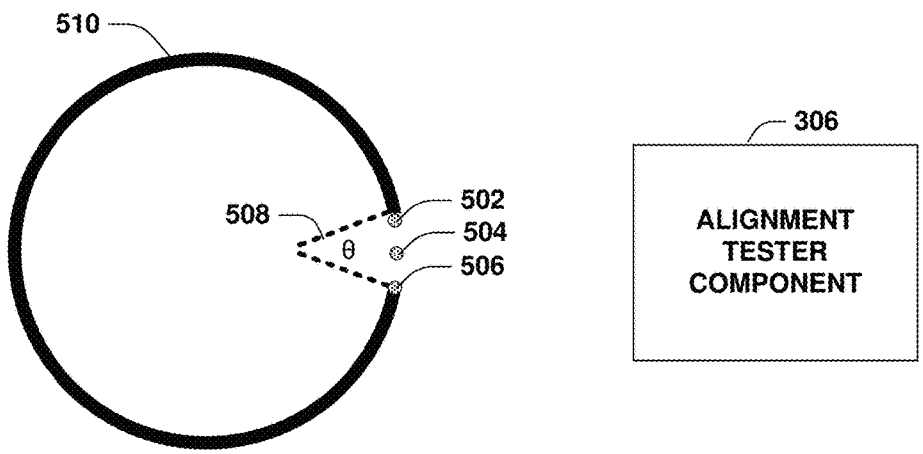
FIG. 5C is an illustration of evaluating a tiered semiconductor structure utilizing a conductive arc, according to some embodiments.

In an embodiment, the alignment tester component 306 determines that the first via 502 has connectivity through the conductive arc 510 to the third via 506, and that the first via 502 does not have connectivity with the second via 504, as illustrated in FIG. 5C. Accordingly, the alignment tester component 306 determines an alignment rotation having a rotational value less than the notch angle 508. In this way, the tiered semiconductor structure 100 is evaluated for misalignment based upon the alignment rotation.

Figure 5D:
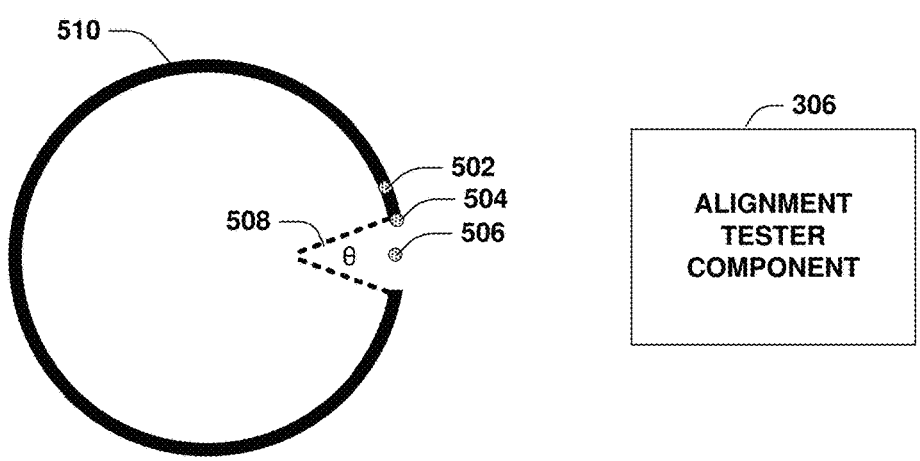
FIG. 5D is an illustration of evaluating a tiered semiconductor structure utilizing a conductive arc, according to some embodiments.

In an embodiment, the alignment tester component 306 determines that the first via 502 has connectivity through the conductive arc 510 to the second via 504, and that the first via 502 does not have connectivity with the third via 506, as illustrated in FIG. 5D. Accordingly, the alignment tester component 306 determines an alignment rotation having a counterclockwise rotation value between half the notch angle 508 and the notch angle 508. In this way, the tiered semiconductor structure 100 is evaluated for misalignment based upon the alignment rotation.

Figure 5E:
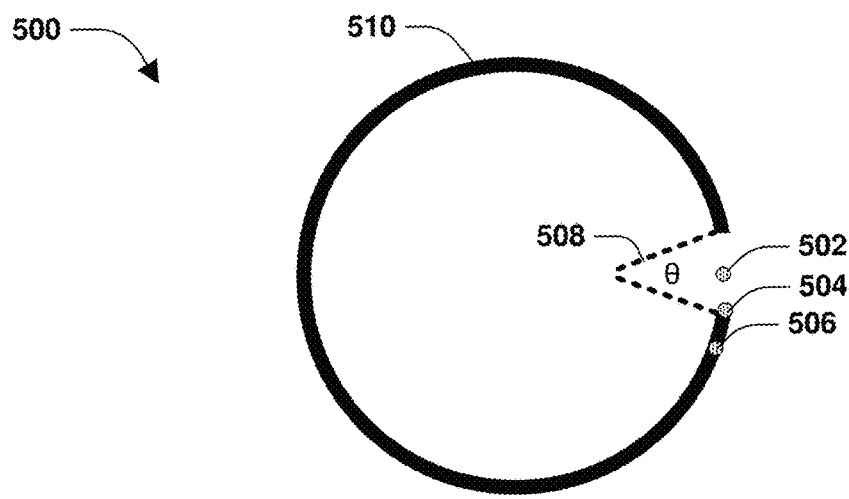
FIG. 5E is an illustration of evaluating a tiered semiconductor structure utilizing a conductive arc, according to some embodiments.

In an embodiment, the alignment tester component 306 determines that the third via 506 has connectivity through the conductive arc 510 to the second via 504, and that the first via 502 does not have connectivity with the third via 506, as illustrated in FIG. 5E. Accordingly, the alignment tester component 306 determines an alignment rotation having a clockwise rotation value between half the notch angle 508 and the notch angle 508. In this way, the tiered semiconductor structure 100 is evaluated for misalignment based upon the alignment rotation.

Figure 5F:
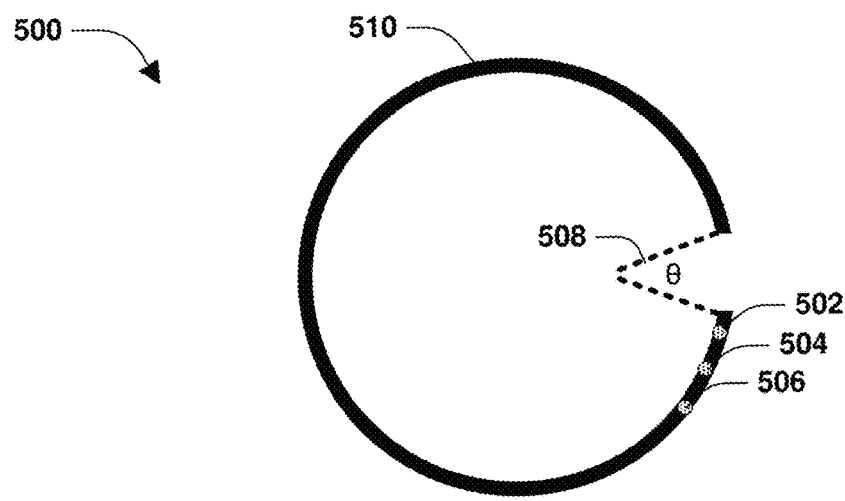
FIG. 5F is an illustration of evaluating a tiered semiconductor structure utilizing a conductive arc, according to some embodiments.

In an embodiment, the alignment tester component 306 determines that the first via 502, the second via 504, and the third via 506 have connectivity through the conductive arc 510, as illustrated in FIG. 5F. Accordingly, the alignment tester component 306 determines an alignment rotation having a rotation value greater than the notch angle 508. In this way, the tiered semiconductor structure 100 is evaluated for misalignment based upon the alignment rotation.

Figure 6:
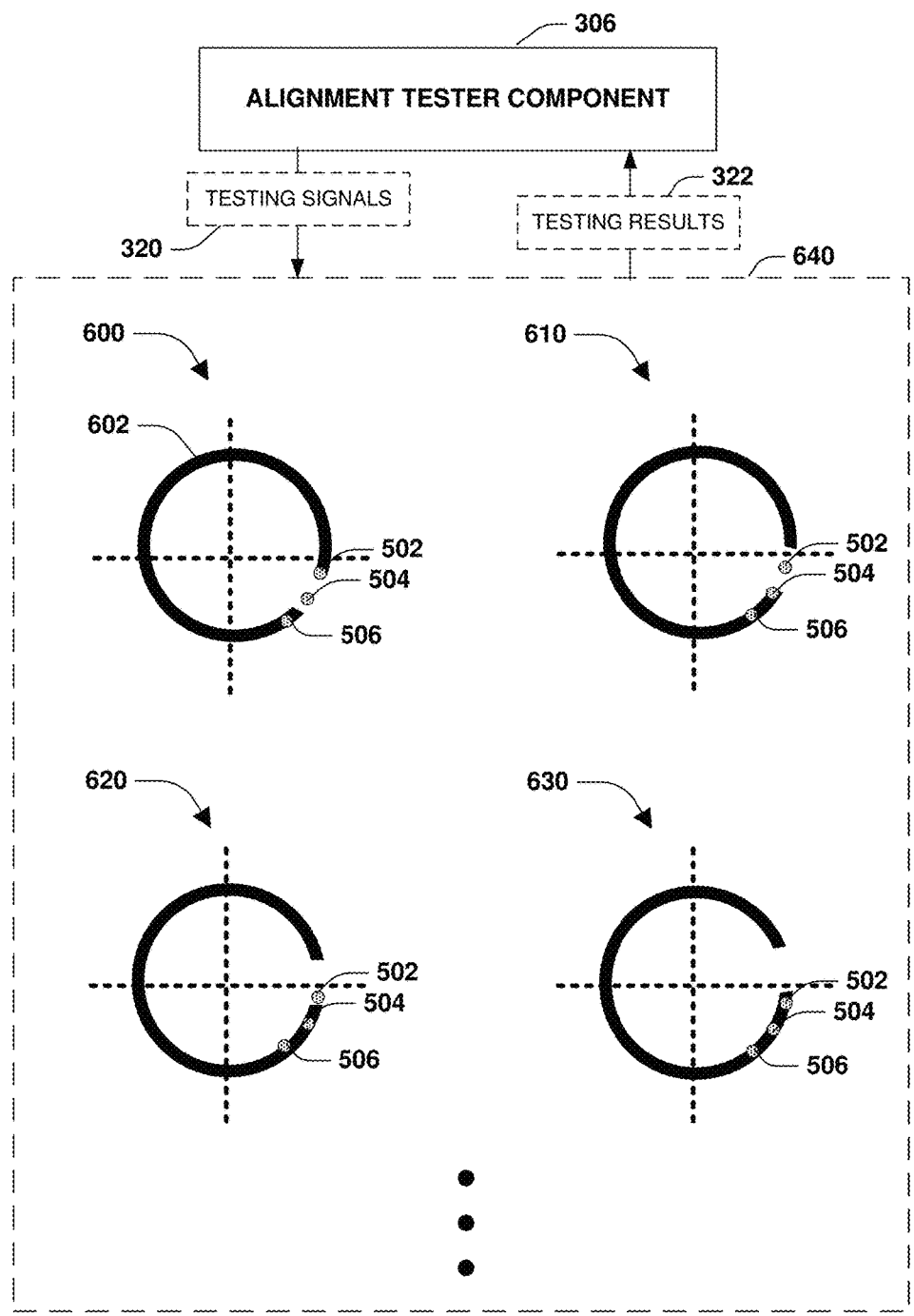
FIG. 6 is an illustration of a set of conductive patterns utilized by an alignment tester component to evaluate a tiered semiconductor structure for misalignment, according to some embodiments.

FIG. 6 illustrates a set of conductive patterns 640 utilized by the alignment tester component 306 to evaluate the tiered semiconductor structure 100 for misalignment. The set of conductive patterns 640 comprises one or more conductive patterns, such as a first conductive pattern 600, a second conductive pattern 610, a third conductive pattern 620, a fourth conductive pattern 630, or other conductive patterns not illustrated. The conductive patterns within the set of conductive patterns 604 have notches formed at notch offset angles, such as the first conductive pattern 600 having a −10° notch offset angle, the second conductive pattern 610 having a −5° notch offset angle, the third conductive pattern 620 have a 0° notch offset angle, and the fourth conductive pattern 630 having a +5 notch offset angle. In an embodiment, the set of conductive patterns 640 are formed, such as within the second layer 104 of the tiered semiconductor structure 100, as a matrix of test structures for alignment testing where the alignment tester component 306 sends testing signals 320 to the tiered semiconductor structure 100 to obtain testing results 322 for misalignment evaluation.

The alignment tester component 306 is configured to evaluate connectivity of one or more vias, such as the first via 502, the second via 504, and the third via 506, based upon a connectivity test having a pass criteria of the first via 502 being connected to the third via 506 and the first via 502 not being connected to the second via 504 through a connectivity ring of a conductive pattern. In an embodiment, the connectivity test is passed for the first conductive pattern 600, but is failed by the second conductive pattern 610, the third conductive pattern 620, and the fourth conductive pattern 630. The connectivity test is passed for the first conductive pattern 600 because the first via 502 is connected to the third via 506 and the first via 502 is not connected to the second via 504 through a connectivity ring 602 of the first conductive pattern 600. Accordingly, the alignment tester component 306 determines an alignment rotation having a rotational value corresponding to the −10° notch offset angle of the first conductive pattern 600. In this way, the tiered semiconductor structure 100 is evaluated for misalignment based upon the alignment rotation.

Figure 7:
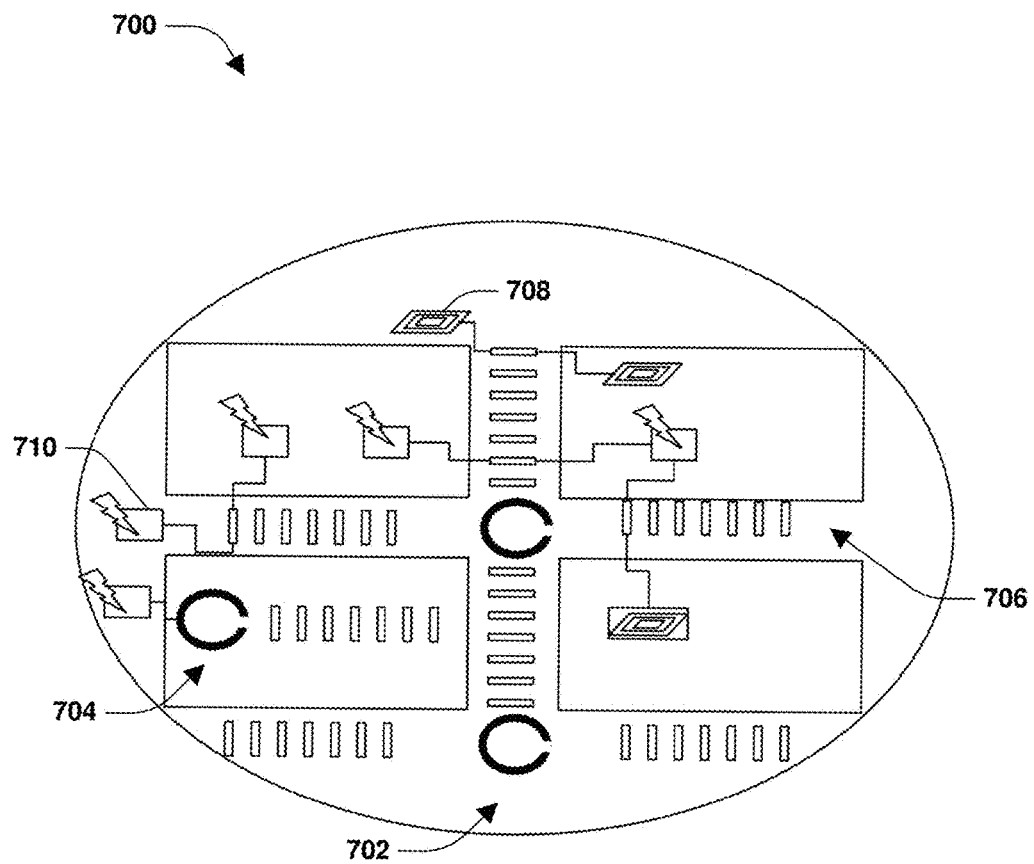
FIG. 7 is an illustration of a tier of a tiered semiconductor structure having one or more test structures formed therein, according to some embodiments.
Figure 8:
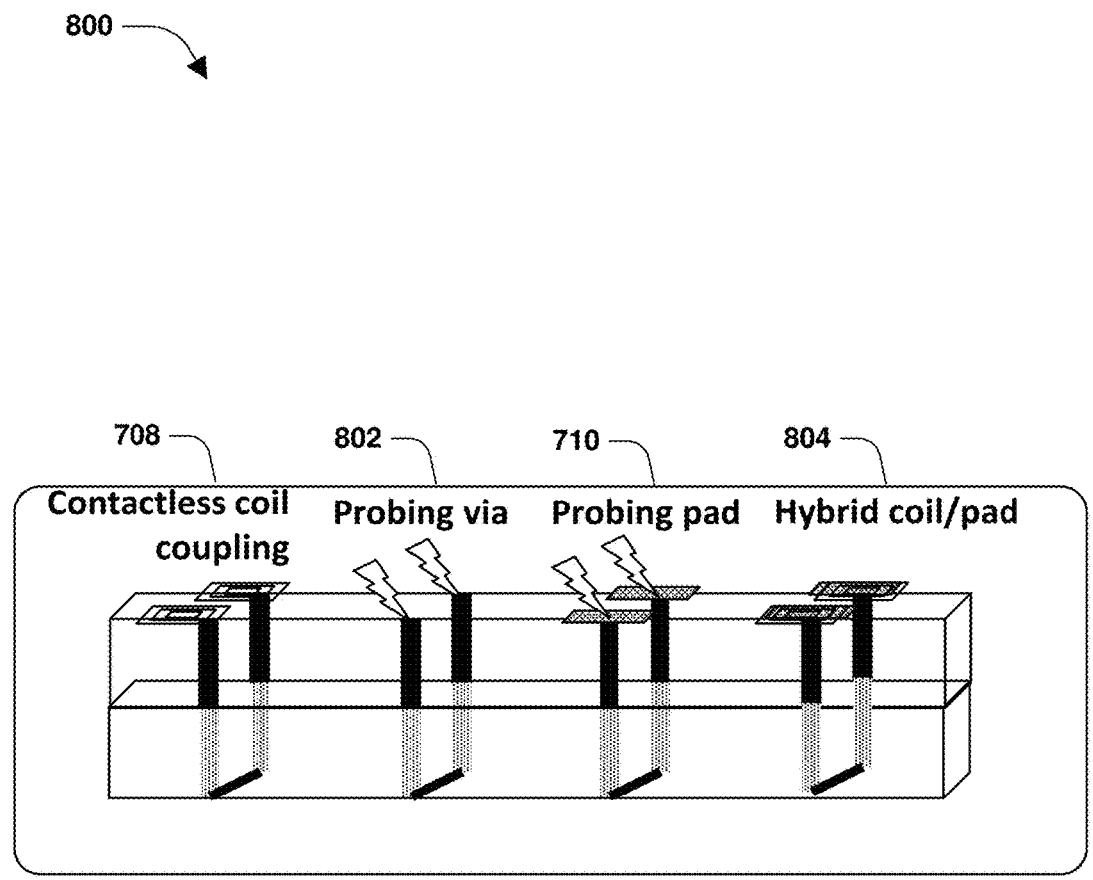
FIG. 8 is an illustration of one or more transmission techniques for transmitting testing signals to test structures, according to some embodiments.

FIG. 7 illustrates a tier 700 of the tiered semiconductor structure 100 having one or more test structures formed therein. In an embodiment, a test structure comprises a structure, such as a conductive arc or a via, used to test for alignment between tiers of the tiered semiconductor structure 100. In an embodiment, a test structure is formed as an alignment mark for prober alignment. In an embodiment, a test structure is formed on a wafer edge 702 of the tier 700. In an embodiment, a test structure is formed on a scribe line 706. In an embodiment, a test structure is formed within a device 704. Testing signals 320 are transmitted to test structures utilizing various transmission techniques, such as a contactless coil coupling 708, a probing pad 710, a probing via 802, or a probe coupling hybrid such as a hybrid coil/pad 804, as illustrated in FIG. 8. In an embodiment, the testing signals 320 are transmitted from a source, such as a tester, that is separated from a test structure. In an embodiment, a direct testing signal is transmitted from automatic test equipment (ATE), such as directly transmitted to a test structure. In an embodiment, a testing trigger, created by a built in self testing engine (BIST) employed by the ATE, is transmitted to initiate testing of test structure.

Figure 9:
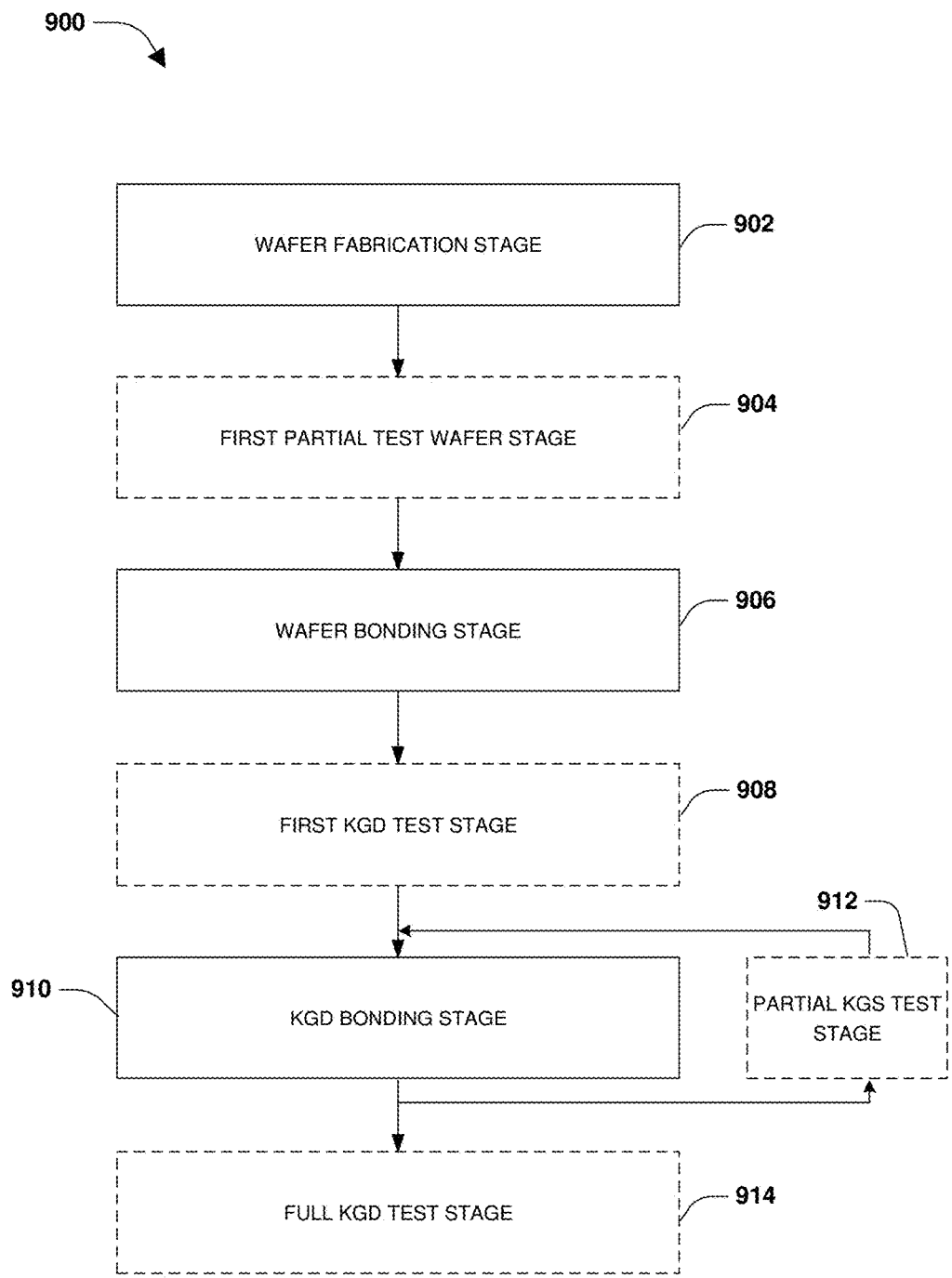
FIG. 9 is an illustration of a stacked CMOS process and test workflow, according to some embodiments.

FIG. 9 illustrates a stacked CMOS process and test workflow 900. At 902, one or more tiers of the tiered semiconductor structure 100 are fabricated. At 904, a first partial test wafer stage is performed. In an embodiment, the first partial test wafer stage transmits one or more testing signals 320, such as direct testing signals or testing triggers, to one or more test structures, such as vias or conductive arcs, formed within the one or more tiers. The testing signals are used to perform connectivity tests to evaluate misalignment between the one or more tiers. In an embodiment, misalignment is identified from a via diameter and an offset detected between vias of two or more tiers. In an embodiment, misalignment is identified from alignment rotation detected between vias of a tier and a conductive arc of another tier. In an embodiment, a repair unit of a testing tier is invoked to process the one or more tiers, such as to repair or correct misalignment, during the first partial test wafer stage 904.

At 906, a wafer bonding stage 906 is performed, such as to bond a wafer with a blank wafer. At 908, a first known good die (KGD) test 908 is performed, such as to detect misalignment. In an embodiment, the repair unit of the testing tier is invoked to process the one or more tiers, such as to repair or correct misalignment, during the first KGD test stage 908. At 910, a KGD bonding stage 910 is performed to bond KGD wafers. At 912, a partial known good stack (KGS) test 912 is performed during the KGD bonding stage 910, such as to evaluate a partial KGS wafer or two bonded KGD wafers for misalignment. In an embodiment, the partial KGS test stage 912 transmits one or more testing signals 320, such as direct testing signals or testing triggers, to one or more test structures, such as vias or conductive arcs, formed within the one or more tiers. The testing signals 320 are used to perform connectivity tests to evaluate misalignment between the one or more tiers, such as misalignment corresponding via diameters, offsets, or alignment rotation measurements. In an embodiment, a testing unit, the repair unit, or a fault tolerance unit of the testing tier are invoked to process the one or more tiers, such as to repair or correct misalignment, during the partial KGS wafer test stage 912. At 914, a full KGS test stage 914 is performed, such as after the KGD bonding stage 910. In an embodiment, the repair unit of the testing tier is invoked to process the one or more tiers, such as to repair or correct misalignment, during the full KGS test stage 914.

According to an aspect of the instant disclosure, a method for evaluating a tiered semiconductor structure is provided. The method comprises evaluating connectivity between a first set of vias within a first layer of a tiered semiconductor structure and a second set of vias within a second layer of the tiered semiconductor structure to determine a via connection count. The via connection count corresponds to a number of via connections that pass a connectivity test. A first via diameter is determined based upon the via connection count. A first offset is determined based upon an offset measurement between a target design via and a measured center via. The first offset comprises an offset distance and an offset direction.

According to an aspect of the instant disclosure, a system for evaluating a tiered semiconductor structure is provided. The system comprises an alignment tester component. The alignment tester component is configured to evaluate connectivity between a first set of vias within a first layer of a tiered semiconductor structure and a second set of vias within a second layer of the tiered semiconductor structure to determine a first via diameter and a first offset based upon a first connectivity test in a first alignment direction. The alignment tester component is configured to evaluate the tiered semiconductor structure for misalignment based upon the first via diameter and the first offset.

According to an aspect of the instant disclosure, a system for evaluating a tiered semiconductor structure is provided. The system comprises an alignment tester component. The alignment tester component is configured to evaluate connectivity, through a conductive arc within a second layer of a tiered semiconductor structure, between a first via, a second via, and a third via of a first layer of the tiered semiconductor structure to determine an alignment rotation. The alignment tester component is configured to evaluate the tiered semiconductor structure for misalignment based upon the alignment rotation.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for evaluating a tiered semiconductor structure, comprising:
    evaluating connectivity, through a conductive arc within a first layer of a tiered semiconductor structure, between a first via, a second via, and a third via of a second layer of the tiered semiconductor structure to determine an alignment rotation, wherein the evaluating connectivity comprises:
        transmitting a first test signal through the first via and measuring a response at the second via and the third via to yield first results, and
        transmitting a second test signal through the second via and measuring a response at the first via and the third via to yield second results;
    evaluating the tiered semiconductor structure for misalignment based upon the alignment rotation; and
    invoking at least one of a testing unit, a repair unit, or a fault tolerance unit to process one or more tiers during stacked CMOS production processing of the tiered semiconductor structure.

2. The method of claim 1, the evaluating connectivity comprising:
    determining a degree to which the conductive arc is rotated relative to a specified orientation of the conductive arc, the first via, the second via, and the third via to determine the alignment rotation.

3. The method of claim 1, wherein the third via is disposed between the first via and the second via.

4. The method of claim 1, the evaluating connectivity comprising:
    determining the alignment rotation using the first results and the second results.

5. The method of claim 1, wherein:
    the conductive arc comprises a first arc segment having a first end and a second end,
    the first end is separated from the second end by a second arc segment that is non-conductive,
    the first via, the second via, and the third via are formed within the second layer and arranged along a third arc segment spanning from the first via to the third via and having a length equal to a length of the second arc segment,
    the second via is disposed between the first via and the third via, and
    when the first layer is aligned with the second layer, the first via contacts the first end of the conductive arc and the third via contacts the second end of the conductive arc.

6. The method of claim 5, wherein the second via is in contact with the second arc segment when the tiered semiconductor structure is aligned.

7. The method of claim 5, wherein the first via, the second via, and the third via are evenly spaced along the third arc segment.

8. The method of claim 5, wherein:
the evaluating connectivity comprises:
  determining the alignment rotation using the first results and the second results, and
the evaluating the tiered semiconductor structure for misalignment comprises:
  determining whether the second layer is misaligned with the first layer based upon the alignment rotation.

9. A method for evaluating a tiered semiconductor structure, comprising:
evaluating connectivity within a first arc segment of a conductive arc, wherein:
  the conductive arc is within a first layer of a tiered semiconductor structure and the connectivity is evaluated between a set of vias within a second layer of the tiered semiconductor structure, and
the evaluating connectivity comprises:
  transmitting a first test signal through a first via of the set of vias and measuring a response at a second via of the set of vias adjacent to the first via and a third via of the set of vias adjacent to the second via to yield first results, and
  transmitting a second test signal through the second via and measuring a response at the first via and the third via to yield second results;
responsive to determining that the first via has connectivity through the first arc segment to the second via, that the first via does not have connectivity to the third via, and that the second via does not have connectivity to the third via, determining a counterclockwise alignment rotation;
evaluating the tiered semiconductor structure for misalignment based upon the counterclockwise alignment rotation; and
invoking at least one of a testing unit, a repair unit, or a fault tolerance unit to process one or more tiers during stacked CMOS production processing of the tiered semiconductor structure.

10. The method of claim 9, wherein the first arc segment has a first end separated from a second end.

11. The method of claim 10, wherein a second arc segment that is non-conductive is disposed between first end and the second end.

12. The method of claim 11, wherein:
the first via, the second via, and the third via are arranged along a third arc segment spanning from the first via to the third via, and
a length of the second arc segment is equal to a length of the third arc segment such that when the tiered semiconductor structure is aligned, the first via contacts the first end of the conductive arc and the third via contacts the second end of the conductive arc.

13. The method of claim 9, wherein the determining that the first via has connectivity through the first arc segment to the second via, that the first via does not have connectivity to the third via, and that the second via does not have connectivity to the third via comprises:
determining that the first test signal was transmitted through the first via and the first arc segment to the second via; and
determining that the first test signal was not transmitted to the third via.

14. A method for evaluating a tiered semiconductor structure, comprising:
evaluating connectivity within a first arc segment of a conductive arc, wherein:
  the conductive arc is within a first layer of a tiered semiconductor structure and the connectivity is evaluated between a set of vias within a second layer of the tiered semiconductor structure, and
the evaluating connectivity comprises:
  transmitting a first test signal through a first via of the set of vias and measuring a response at a second via of the set of vias adjacent to the first via and a third via of the set of vias adjacent to the second via to yield first results, and
  transmitting a second test signal through the second via and measuring a response at the first via and the third via to yield second results;
responsive to determining that the third via has connectivity through the first arc segment to the second via, that the first via does not have connectivity to the third via, and that the first via does not have connectivity to the second via, determining a clockwise alignment rotation value;
evaluating the tiered semiconductor structure for misalignment based upon the clockwise alignment rotation value; and
invoking at least one of a testing unit, a repair unit, or a fault tolerance unit to process one or more tiers during stacked CMOS production processing of the tiered semiconductor structure.

15. The method of claim 14, wherein the determining that the third via has connectivity through the first arc segment to the second via, that the first via does not have connectivity to the third via, and that the first via does not have connectivity to the second via comprises:
determining that the second test signal was transmitted through the second via and the first arc segment to the third via; and
determining that the first test signal was not transmitted to the third via.

16. The method of claim 14, wherein the first arc segment has a first end separated from a second end by a third arc segment.

17. The method of claim 16, wherein:
the set of vias are arranged along a second arc segment spanning from the first via to the third via, and
a length of the second arc segment is equal to a length of the third arc segment.

18. The method of claim 17, wherein the set of vias are evenly spaced along the second arc segment between the first via and the third via.

19. The method of claim 15, wherein the determining that the third via has connectivity through the first arc segment to the second via, that the first via does not have connectivity to the third via, and that the first via does not have connectivity to the second via comprises:
determining that the first test signal was not transmitted to the second via.

20. The method of claim 13, wherein the determining that the first via has connectivity through the first arc segment to the second via, that the first via does not have connectivity to the third via, and that the second via does not have connectivity to the third via comprises:
determining that the second test signal was not transmitted to the third via.

* * * * *